US006777942B2

(12) United States Patent
Schadhauser

(10) Patent No.: US 6,777,942 B2
(45) Date of Patent: Aug. 17, 2004

(54) OPERATING DEVICE FOR GAS DISCHARGE LAMPS WITH DETECTION OF FILAMENT BREAKAGE

(75) Inventor: Klaus Schadhauser, Munich (DE)

(73) Assignee: Patent-Treuhand-Gesellschaft fuer Elektrische Gluehlampen mbH, Munich (DE)

( * ) Notice: Subject to any disclaimer, the term of this patent is extended or adjusted under 35 U.S.C. 154(b) by 0 days.

(21) Appl. No.: 09/961,315

(22) Filed: Sep. 25, 2001

(65) Prior Publication Data

US 2002/0050824 A1 May 2, 2002

(30) Foreign Application Priority Data

Sep. 27, 2000 (DE) ........................................ 100 48 976

(51) Int. Cl.[7] ......................... G01R 31/00; G01R 31/08

(52) U.S. Cl. ....................... 324/414; 324/521; 324/403

(58) Field of Search ................................ 324/414, 521, 324/403, 76.52, 76.77; 315/307

(56) References Cited

U.S. PATENT DOCUMENTS 4,277,728 A * 7/1981 Stevens ...................... 315/307
4,949,013 A 8/1990 Zuchtriegel ................. 315/106
5,004,969 A * 4/1991 Schanin ...................... 323/235
5,075,599 A * 12/1991 Overgoor et al. ........... 315/224
5,181,026 A * 1/1993 Granville ............... 340/870.28
5,578,908 A * 11/1996 Persson ...................... 315/307
5,754,036 A * 5/1998 Walker ....................... 323/237
5,925,990 A * 7/1999 Crouse et al. ............. 315/307
5,952,832 A 9/1999 Stevanovic et al. ......... 324/414
6,008,593 A * 12/1999 Ribarich ..................... 315/307
6,100,647 A * 8/2000 Giannopoulos et al. ..... 315/224
6,211,623 B1 * 4/2001 Wilhelm et al. ............ 315/224
6,300,777 B1 * 10/2001 Ribarich ..................... 324/652
6,414,400 B1 * 7/2002 Scott et al. ............... 290/40 C

FOREIGN PATENT DOCUMENTS

DE 38 05 510 8/1989

* cited by examiner

*Primary Examiner*—N. Le
*Assistant Examiner*—John Teresinski
(74) *Attorney, Agent, or Firm*—Carlo S. Bessone

(57) ABSTRACT

Disconnection device for an electronic operating device for gas discharge lamps. The filament breakage of a lamp is evaluated by detecting the current through a component which flows through the filaments. This is performed either by detecting this current with the aid of an optocoupler or by measuring the phase of the load circuit current.

5 Claims, 2 Drawing Sheets

OPERATING DEVICE FOR GAS DISCHARGE LAMPS WITH DETECTION OF FILAMENT BREAKAGE

TECHNICAL FIELD

The invention relates to an operating device for one or more low-pressure discharge lamps having filaments. In particular, it relates to a circuit which detects the breakage of a filament of a lamp and disconnects the operating device.

PRIOR ART

The service life of a low-pressure discharge lamp fitted with filaments is determined chiefly by the service life of the filaments. If the filaments are consumed, there is firstly an increase in the lamp voltage, accompanied by an undesired temperature increase in the filament region of the lamp. The lamp also mostly shows a rectifying effect at this stage. Finally, the filament breaks, and this can lead to destruction of the lamp operating device and to a dangerous overheating of the ends of the lamp. Some disconnection devices are known for reliable operation of the lamp and to protect the operating device.

It has also emerged that monitoring the filaments with regard to breakage suffices in order to be able to ensure reliable operation of the system of lamp and operating device. In known solutions, it is detected whether a DC test current can flow through the filaments to be tested (DE 3805510). The disadvantage of this method is that the test current flows in addition to the current required for normal operation, and thus constitutes an additional load for the filaments.

Also obvious is the use of an AC test current. For this purpose, the current supply for the gas discharge is conducted via in each case only one terminal of the filaments. The respective other terminals of the filaments are bridged by a capacitor (termed resonance capacitor below). This resonance capacitor is mostly also used to generate the starting voltage, and therefore does not constitute an additional outlay on components. The current for the gas discharge is provided by an AC voltage generator. This current is now divided into a portion which flows through the gas discharge path and a portion which flows through the resonance capacitor. In the case of filament breakage, the current component through the resonance capacitor vanishes. In order to disconnect the operating device in the case of filament breakage, it is therefore necessary to monitor the current through the resonance capacitor. It is advantageous to be able to evaluate this current in a potential-free fashion. U.S. Pat. No. 5,952,832 proposes a transformer whose primary winding is connected in series with the resonance capacitor. It is now possible on the secondary side of the transformer to evaluate the current through the resonance capacitor in a potential-free fashion. However, the use of a transformer signifies a substantial outlay on cost.

SUMMARY OF THE INVENTION

It is the object of the present invention to provide as cost-effectively as possible a potential-free evaluation of the current through the resonance capacitor for the purpose of disconnecting the operating device in the event of filament breakage.

As a rule, the operating device includes an AC voltage generator which feeds energy into the load circuit. The principle of such an arrangement is illustrated in FIG. 1. The series circuit of the lamp reactor L1 and the lamp Lp is connected to the two terminals of the AC voltage generator G. A filament terminal is used in each case to connect the lamp Lp. The resonance capacitor C1 is connected to the respective other filament terminal. Describing the lamp by an equivalent load resistor R1 yields the following expression for the load circuit impedance Z as a function of the complex frequency s:

$$Z(s) = \frac{R_1 + sL_1 + s^2 L_1 C_1 R_1}{1 + sC_1 R_1}$$

The phase characteristic of this expression is plotted in FIG. 2 against the technical frequency. The resonance capacitor C1 is the parameter. The value of its capacitance is 10 nF or 10 pF. R1 has a resistance of respectively 500 ohms, and L1 respectively has an inductance of 2 mH. 500 ohms is the typical value for the equivalent resistance of a compact fluorescent lamp, while 2 mH represents a typical value for the inductance of a lamp reactor suitable for operating this lamp. For this arrangement, a value of 10 nF is suitable for the capacitance of the resonance capacitor. In accordance with FIG. 2, a phase angle of approximately 70° is yielded for the load circuit impedance given an operating frequency of 50 kHz. If a filament now breaks, the resonance capacitor is disconnected from the load circuit. A value of 10 pF can be assumed as residual capacitance, which is essentially formed by the wiring. In accordance with FIG. 2, it follows that in the case of a broken filament a phase angle of approximately 50° results for the load circuit impedance. A phase detector which triggers a disconnection of the operating device now suffices for detection as claimed in the invention if the phase of the load circuit impedance drops by a prescribed value.

A further cost-effective possibility for potential-free detection of a filament breakage is yielded by the use of an optocoupler. The current through the resonance capacitor or a part thereof is conducted through the light emitting diode (input) of the optocoupler. This light emitting diode is extinguished in the case of filament breakage. This can be detected in the potential-free fashion at the output of the optocoupler and trigger disconnection of the operating device.

DESCRIPTION OF THE DRAWINGS

The invention is to be explained in more detail below with the aid of exemplary embodiments. In the drawing.

Capacitors are denoted below by the letter C, resistors by R, inductors by L, transistors by T and diodes by D, followed by a number in each case.

Figure 1:
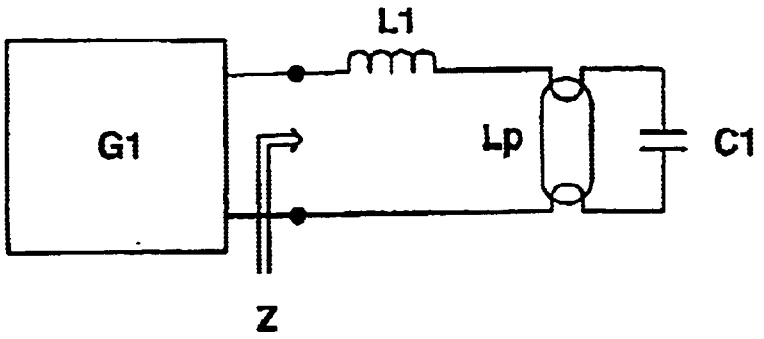
FIG. 1 shows a circuit diagram of an operating device for a gas discharge lamp.
Figure 2:
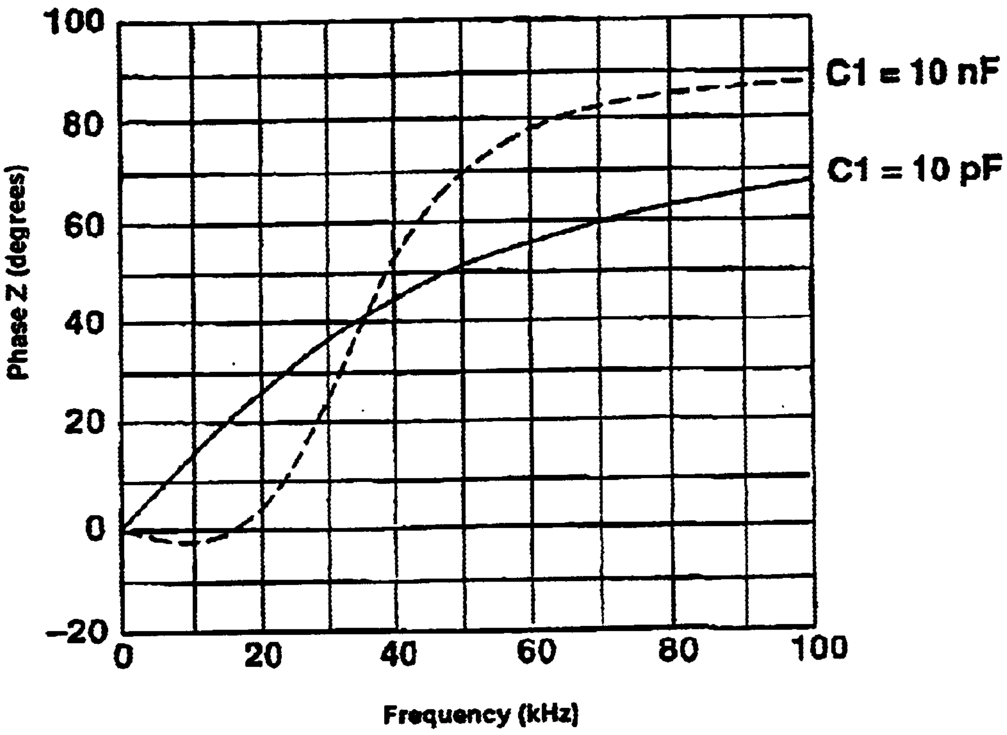
FIG. 2 shows plot of phase angle as a function of technical frequency.
Figure 3:
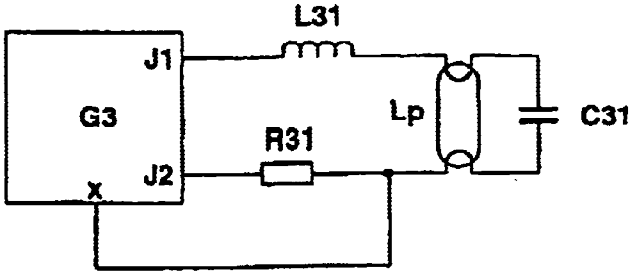
FIG. 3 shows a circuit diagram of an operating device for a gas discharge lamp with disconnection according to the invention in the event of breakage of one of the two filaments, with the aid of phase detection.

An AC voltage generator G3 is illustrated in FIG. 3. Its power supply is not presented. It can be fed, for example, by means of a DC voltage source. The load circuit comprising L31, the lamp Lp, C31 and R31 is connected to its output terminals J1, J2. The load circuit is designed as a series circuit of L31, the lamp Lp and R31. Only one terminal of the two filaments is used in each case in this series circuit for connection of the lamp Lp. C31 is connected in parallel with the lamp via the respective other terminal of the two filaments. R31 serves to detect the load current. A voltage is tapped at the connecting point between R31 and the lamp Lp, and fed to the input x of the AC voltage generator G3. This voltage is proportional to the load current. All the information required for determining the phase of the load current impedance Z is therefore available in the AC voltage generator G3. The phase of the load current impedance Z is the difference between the phase of the output voltage at the output terminals J1, J2 and the phase of the load circuit current. In connection with the present invention, phase is understood as the component of a periodic function which has passed since the last zero crossing of this function. If the time for a complete period is set at 360°, the phase can be described as the phase angle in degrees. According to this definition, consideration of the phase angle is not limited to sinusoidal processes. The AC voltage generator frequently outputs a substantially rectangular voltage.

The determination of the phase of the load circuit impedance can be traced back to a time measurement. The instant of the zero crossing of the voltage at the output terminals J1, J2 in the AC voltage generator G3 is known, since this voltage is itself produced by the AC voltage generator G3. The time which passes until a zero crossing of the measured voltage is detected at the input x of the AC voltage generator G3 after a zero crossing of the voltage at the output terminals J1, J2 is a measure of the phase of the load circuit impedance. The described time interval is the shorter the smaller the phase of the load circuit impedance. A microcontroller can monitor the undershooting of a prescribed limit for this time interval. The microcontroller can serve simultaneously to generate the output voltage of the AC voltage generator G3. Only R3 need be used as component in this case to disconnect the operating device in the event of filament breakage. The remainder of the implementation resides in the programming of the microcontroller. The expression zero crossing is understood in the above discussion as a change in polarity, any direct components of the variables under consideration that may occur not being considered.

Figure 4:
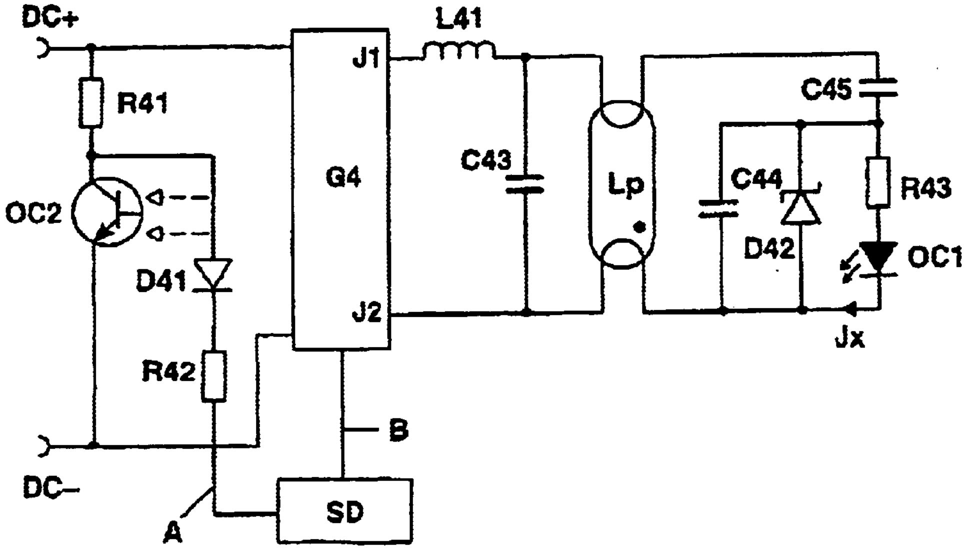
FIG. 4 shows a circuit diagram of an operating device for a gas discharge lamp with disconnection according to the invention by means of an optocoupler, in the event of breakage of one of the two filaments.

An operating device which accomplishes the potential-free detection of the filament breakage with the aid of an optocoupler is illustrated in FIG. 4. The AC voltage generator G4 makes available an AC voltage for operating the lamp Lp at its output terminals J1, J2. The series circuit of L41 and C43 is connected between the output terminals J1, J2. The lamp Lp is connected in parallel with C43 with one terminal each of its two filaments. The series circuit of C44 and C45 is connected between the respective other terminals of the two filaments. C43, C44 and C45 act in their totality as a resonance capacitor. The series circuit of R43 and the input diode of the optocoupler OC1 are connected in parallel with C44. R43 serves to limit the current Jx through the input diode of the optocoupler OC1. Moreover, the Zener diode D42 is connected in parallel with C44. Said diode serves to limit the voltage present across the series circuit of R43 and the input diode of the optocoupler OC1. C44 and C45 form a capacitive voltage divider which matches the voltage level across the lamp Lp to the required voltage level at the input diode of the optocoupler OC1. The current which flows over the filaments during operation of the lamp can be set by selecting the ratio of the capacitors C43, C44 and C45 to one another.

Power for the AC voltage generator G4 is fed via the DC voltage supply lead DC+ and DC−. The series circuit of R41 and the output transistor of the optocoupler OC2 is connected therebetween. The input A of the disconnection logic circuit SD is connected to the connecting point of R41 and the output transistor of the optocoupler OC2 via the series circuit of D41 and R42. If the filaments of the lamp Lp are intact, a current Jx flows, thereby turning on the output transistor of the optocoupler OC2. The voltage at the input A of the disconnection logic circuit is therefore small with reference to the DC voltage potential DC−. If a filament breaks, current Jx no longer flows. As a result, the output transistor of the optocoupler OC2 acquires a high resistance, and the voltage at the input A of the disconnection logic circuit A rises. The disconnection logic circuit includes at least one trigger and a timing element. As soon as the voltage at the input of the disconnection logic circuit lies above a predetermined threshold for a prescribed time, the AC voltage generator G4 is disconnected via the line B.

The exemplary embodiments in FIGS. 3 and 4 are elaborated in each case for only one lamp. However, it is also possible to apply the disconnection according to the invention for operating devices for a plurality of lamps, as well.

What is claimed is:

1. An electronic operating device for operating one or more gas discharge lamps which contain filaments, the operating device having the following features:

an AC voltage generator (G3) which feeds an AC voltage into a load circuit, a load circuit which contains at least one lamp and is designed such that the phase of the current which flows in the load circuit is determined with reference to the applied AC voltage, essentially by at least one component which conducts a current which flows through the filaments, and a device for measuring the phase of the current, which flows in the load circuit, with reference to the applied AC voltage wherein the operating device is disconnected as soon as the above-named device for measuring the phase detects a phase angle which violates a prescribed limiting value and carries out a time measurement between the instant of the zero crossing of the AC voltage supplied by the AC voltage generator (G3) and the instant of the zero crossing of the load circuit current.

2. The operating device as claimed in claim 1, wherein the component whose current flows through the filaments is a capacitor (C31).

3. An electronic operating device for operating one or more gas discharge lamps which contain filaments, the operating device having the following features:

an AC voltage generator (G3) which feeds an AC voltage into a load circuit, an input (B) at the above AC voltage generator (G3), the operating device being disconnected if a voltage which violates a prescribed limiting value is present at this input (B);

wherein the load circuit contains an optocoupler whose input current (Jx) flows through the filaments, and the output of the optocoupler triggers disconnection of the operating device at the input (B) of the AC voltage generator (G3) if the input current of the optocoupler (Jx) becomes negligibly small.

4. The operating device as claimed in claims 3, wherein the operating device contains a disconnection logic circuit (SD) which contains at least one trigger and a timing element and supplies a signal which disconnects the operating device via the input (B) of the AC voltage generator (G3).

5. The operating device as claimed in claim 4, wherein the disconnection logic circuit (SD) has an input (A) which is connected to the output of the optocoupler.

* * * * *